United States Patent
Liu et al.

(10) Patent No.: US 7,292,500 B2
(45) Date of Patent: Nov. 6, 2007

(54) REDUCING READ DATA STROBE LATENCY IN A MEMORY SYSTEM

(75) Inventors: Jin Song Liu, Shanghai (CN); Michael L. Snodgrass, Allentown, PA (US); Jia Jing Wang, Arlington, VA (US); Tao Wang, Shanghai (CN); Wen Zhu, Shanghai (CN)

(73) Assignee: Agere Systems Inc., Allentown, PA (US)

( * ) Notice: Subject to any disclaimer, the term of this patent is extended or adjusted under 35 U.S.C. 154(b) by 178 days.

(21) Appl. No.: 11/193,796

(22) Filed: Jul. 29, 2005

(65) Prior Publication Data
US 2007/0025175 A1   Feb. 1, 2007

(51) Int. Cl.
*G11C 8/00* (2006.01)
(52) U.S. Cl. .................. 365/233; 365/193; 365/159
(58) Field of Classification Search ............. 365/233, 365/193, 159; 327/49, 159
See application file for complete search history.

(56) References Cited

U.S. PATENT DOCUMENTS

| | | | |
|---|---|---|---|
| 5,687,203 A * | 11/1997 | Baba ..................... 375/376 |
| 6,262,611 B1 * | 7/2001 | Takeuchi ................ 327/159 |
| 6,373,911 B1 * | 4/2002 | Tajima et al. ............ 375/375 |
| 6,777,980 B2 * | 8/2004 | Young et al. ............. 326/41 |
| 6,950,487 B2 * | 9/2005 | Lin et al. ................ 375/376 |
| 7,106,655 B2 * | 9/2006 | Lee ....................... 365/233 |
| 2006/0202875 A1 * | 9/2006 | Fujisawa ................ 341/100 |

* cited by examiner

*Primary Examiner*—Connie C. Yoha

(57) ABSTRACT

A read activity detector circuit for use in a random access memory array includes a plurality of synchronizer circuits operative to receive a plurality of respective reference clock signals having a frequency that is substantially the same as a core reference clock and having different phases relative to one another. Each of the synchronizer circuits, in response to a first control signal presented thereto, generates an output signal having a rising edge or a falling edge which is substantially aligned to a rising edge or a falling edge of the reference clock signal corresponding thereto. The activity detector circuit further includes a controller operative to receive the respective output signals from the plurality of synchronizer circuits and to generate an output signal as a function thereof which is indicative of data to be read from the random access memory array.

18 Claims, 8 Drawing Sheets

REDUCING READ DATA STROBE LATENCY IN A MEMORY SYSTEM

FIELD OF THE INVENTION

The present invention relates generally to memory systems, and more particularly relates to techniques for reducing read data strobe latency in a memory system.

BACKGROUND OF THE INVENTION

Over the past several years, memory systems, particularly in the personal computer (PC) sector, have seen a dramatic increase in data bandwidth requirements. One industry segment that has experienced significant growth as a result of this increase in data bandwidth requirements is dynamic random access memory (DRAM), particularly double data rate (DDR) synchronous DRAM (SDRAM). DDR memory architectures use both the rising and falling edges of a clock signal to access memory, which facilitates data transmission at twice the standard clock rate. DDR SDRAM also consumes less power than conventional SDRAM, with an operational supply voltage of about 2.5 volts, instead of 3.3 volts for SDRAM.

DDR memory's ability to transfer data at double the standard SDRAM data rate often imposes significant challenges on memory system designers. The speeds at which a memory controller must reliably operate (e.g., 400 megahertz (MHz) across traces on a typical woven glass reinforced epoxy resin printed circuit board (PCB)) make PCB layout particularly challenging. Moreover, incorporating a DDR memory interface into a flexible field programmable gate array (FPGA) fabric presents the designer with the related complexity of meeting very critical and tight timing constraints in an inherently non-deterministic routing fabric. The difficulties often encountered arise predominantly from the physical realities of working with data windows that are well within the magnitude of signal propagation delays in PCB and FPGA routing (e.g., about 2.5 nanoseconds (ns) or less for a 400 MHz clock). These timing requirements are further complicated by the variation in logic speed over process, voltage and/or temperature (PVT) conditions to which the memory system may be subjected. The memory system designer can no longer simply connect data lines and address lines and expect to have a robust, high-speed memory interface.

Depending on the layout of the memory system on a PCB and on the number of banks of memory employed, if a memory controller must fetch data from a large number of banks concurrently, the difference in board delays between the various memory banks and the controller can often exceed one clock cycle, thereby increasing latency in the memory system. One known approach which attempts to address this issue is to compute a round trip (RT) delay value for each memory bank in the system, and to store the various RT delay values in a register. A programmable delay line is then utilized in the memory system for selectively delaying a read strobe signal based on the computed RT delay value(s) corresponding to the memory bank(s) being read. This approach, however, requires an initialization procedure for determining the RT delay value of each memory bank, and additionally requires a programmable delay line which significantly increases the cost of the memory system. Moreover, this approach does not adjust for variations in certain operating characteristics of the memory system, such as, for example, supply voltage and/or temperature, which may occur after the RT delay values have been determined.

Accordingly, there exists a need for techniques for reducing read strobe latency in a memory system that does not suffer from one or more of the problems exhibited by conventional memory systems.

SUMMARY OF THE INVENTION

The present invention meets the above-noted need by providing, in an illustrative embodiment, an activity detector circuit for reducing read strobe latency in a DDR SDRAM memory system. The activity detector circuit is operative to detect read activity across multiple phases of a core reference clock and to convert the activity into a synchronous output signal indicative of data to be read from a DDR SDRAM array external to the activity detector.

In accordance with one aspect of the invention, a read activity detector circuit for use in a random access memory array includes a plurality of synchronizer circuits operative to receive a plurality of respective reference clock signals each having a frequency that is substantially the same as a frequency of a core reference clock and having different phases relative to one another. Each of the synchronizer circuits, in response to a first control signal presented thereto, generates an output signal having a rising edge or a falling edge which is substantially aligned to a rising edge or a falling edge of the reference clock signal corresponding thereto. The activity detector circuit further includes a controller operative to receive the respective output signals from the plurality of synchronizer circuits and to generate an output signal as a function thereof which is indicative of data to be read from the random access memory array.

In accordance with another aspect of the invention, a memory system includes a random access memory array and a memory controller circuit connected to the memory array. The memory controller circuit includes at least one read activity detector circuit comprising a plurality of synchronizer circuits operative to receive a plurality of respective reference clock signals having a frequency that is substantially the same as a core reference clock and having different phases relative to one another. Each of the synchronizer circuits, in response to a first control signal presented thereto, generates an output signal having a rising edge or a falling edge which is substantially aligned to a rising edge or a falling edge of the reference clock signal corresponding thereto. The at least one read activity detector circuit further includes a controller operative to receive the respective output signals from the plurality of synchronizer circuits and to generate an output signal as a function thereof which is indicative of data to be read from the random access memory array.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative activity detector circuits, as may be used, for example, in a DDR SDRAM memory system. It should be understood, however, that the present invention is not limited to these or any particular circuit arrangements. Rather, the invention is more generally applicable to techniques for reducing read data strobe latency in a memory system. Although implementations of the present invention are described herein with specific reference to DDR SDRAM, it is to be understood that the invention is not limited to such memory, and that other suitable memory, such as, for example, fast cycle random access memory (FCRAM), quad data rate (QDR) SDRAM, reduced latency DRAM (RLDRAM), etc., may be similarly employed, as will become apparent to those skilled in the art.

Figure 1:
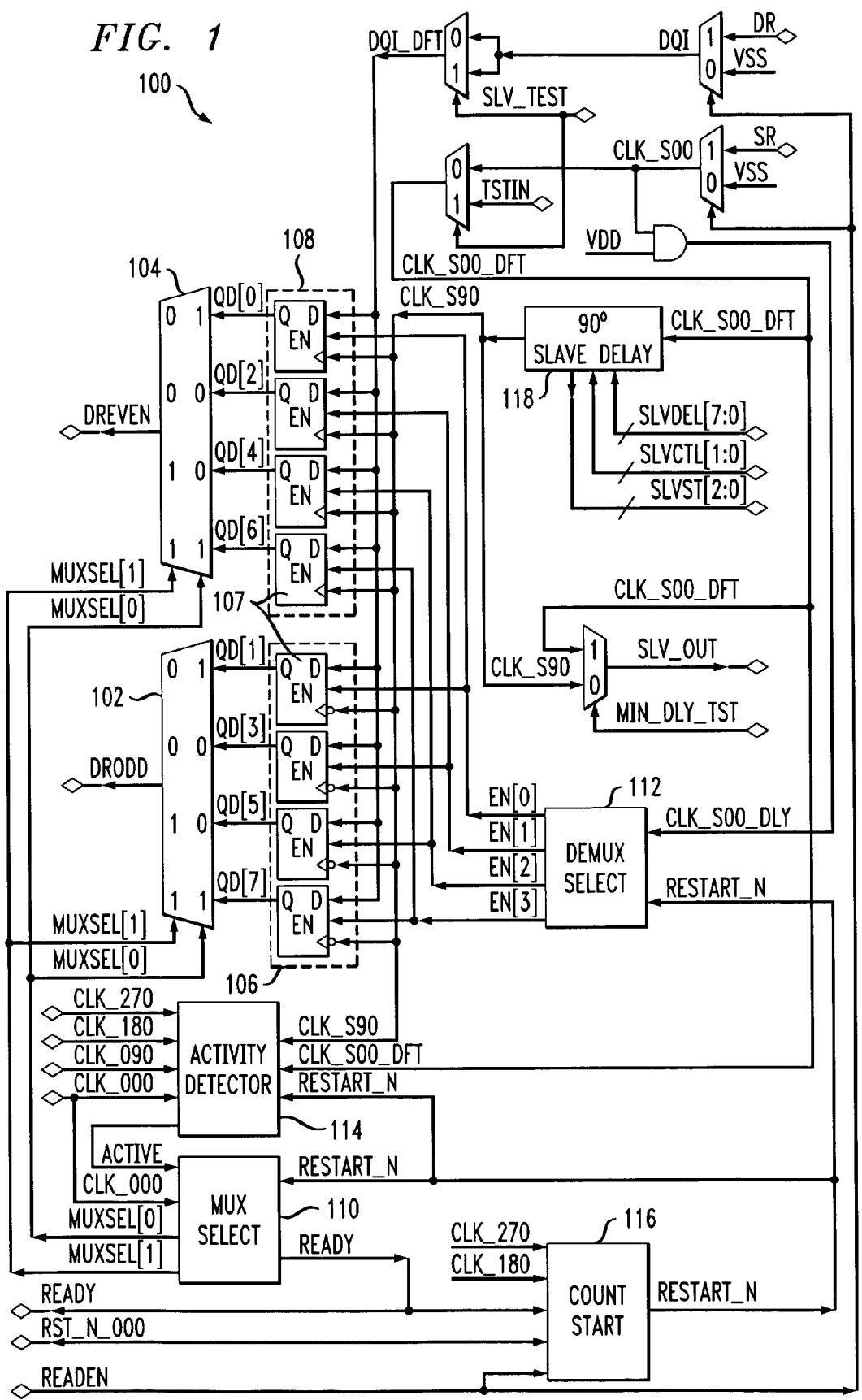
FIG. 1 is a schematic diagram illustrating an exemplary DDR SDRAM physical layer (PHY) memory interface circuit in which the techniques of the present are implemented.

FIG. 1 is a schematic diagram illustrating an exemplary DDR SDRAM physical layer (PHY) memory interface circuit 100 in which the techniques of the present are implemented. The illustrative memory interface circuit 100 includes first and second mulitplexers 102 and 104, first and second data registers 106 and 108 coupled to the first and second multiplexers, respectively, multiplexer selection circuitry 110, demultiplexer selection circuitry 112, an activity detector circuit 114, count start circuitry 116, a ninety-degree slave delay circuit 118, as well as additional support circuitry for performing various other functions in the memory interface circuit 100. Each of the data registers 106, 108 preferably comprises a plurality of individual flip-flops 107 (e.g., D-type flip-flops), or a suitable alternative storage arrangement.

The first and second multiplexers 102, 104 are preferably configured for accessing odd and even data bits, respectively, in an external DDR SDRAM array (not shown). Each of the data registers 106, 108 is preferably operative to store odd or even data bits, respectively, read from the DDR SDRAM array. For example, register 106 preferably receives data from odd memory locations and generates odd data signals QD[1], QD[3], QD[5] and QD[7]. Likewise, register 108 preferably receives data from even memory locations and generates even data signals QD[0], QD[2], QD[4] and QD[6]. Each multiplexer 102, 104 preferably generates a corresponding output signal, namely, DRODD and DREVEN, respectively. Multiplexer selection circuitry 110 is operative to generate control signals, namely, MUX-SEL[0] and MUXSEL[1], for selecting which one of the four data signals from each multiplexer 102, 104 is to produce the corresponding output signal DRODD, DREVEN. It is to be understood that the exemplary memory interface circuit 100 is not limited to the number of data bits shown.

Demultiplexer selection circuitry 112 is preferably operative to generate output control signals, EN[0], EN[1], EN[2] and EN[3], for enabling one of individual flip-flops 107 in each of the data registers 106, 108 at any given time. The output control signals EN[0] through EN[3] are generated as a function of input control signals, namely, CLK_S00_DLY, which may be a delayed version of a read data strobe signal, SR, received by the memory interface circuit 100 from the external DDR SDRAM array, and RESTART_N, which is a reset signal generated by count start circuit 116. The flip-flops 107 in data registers 106, 108 are preferably clocked by a clock signal CLK_S90, which is essentially a ninety-degree phased shifted version of the read data strobe signal SR. Clock signal CLK_S90 may be generated by the 90-degree slave delay circuit 118, or alternative delay control circuitry.

Activity detector 114 is preferably operative to generate a control signal, ACTIVE, for enabling the multiplexer selection circuitry 110. Additionally, a READY signal generated by the multiplexer selection circuitry 110 as an output of the memory interface circuit 100 is a function of the ACTIVE signal. The READY signal is preferably indicative that data is available to be read from the memory interface circuit 100. In accordance with one aspect of the invention, in order to reduce read data strobe latency, the activity detector 114 is preferably operative to sample the read data strobe signal at multiple phases of a reference clock and to select which of the phases of the reference clock is most closely aligned with a change in state of the strobe signal. By sampling the read data strobe signal at multiple phases of the reference clock, rather than just a single phase as is conventionally done, the activity detector 114 functions, at least in part, to more accurately frame a window for reading data, thereby reducing latency in the memory system by one or more clock cycles.

Figure 2A:
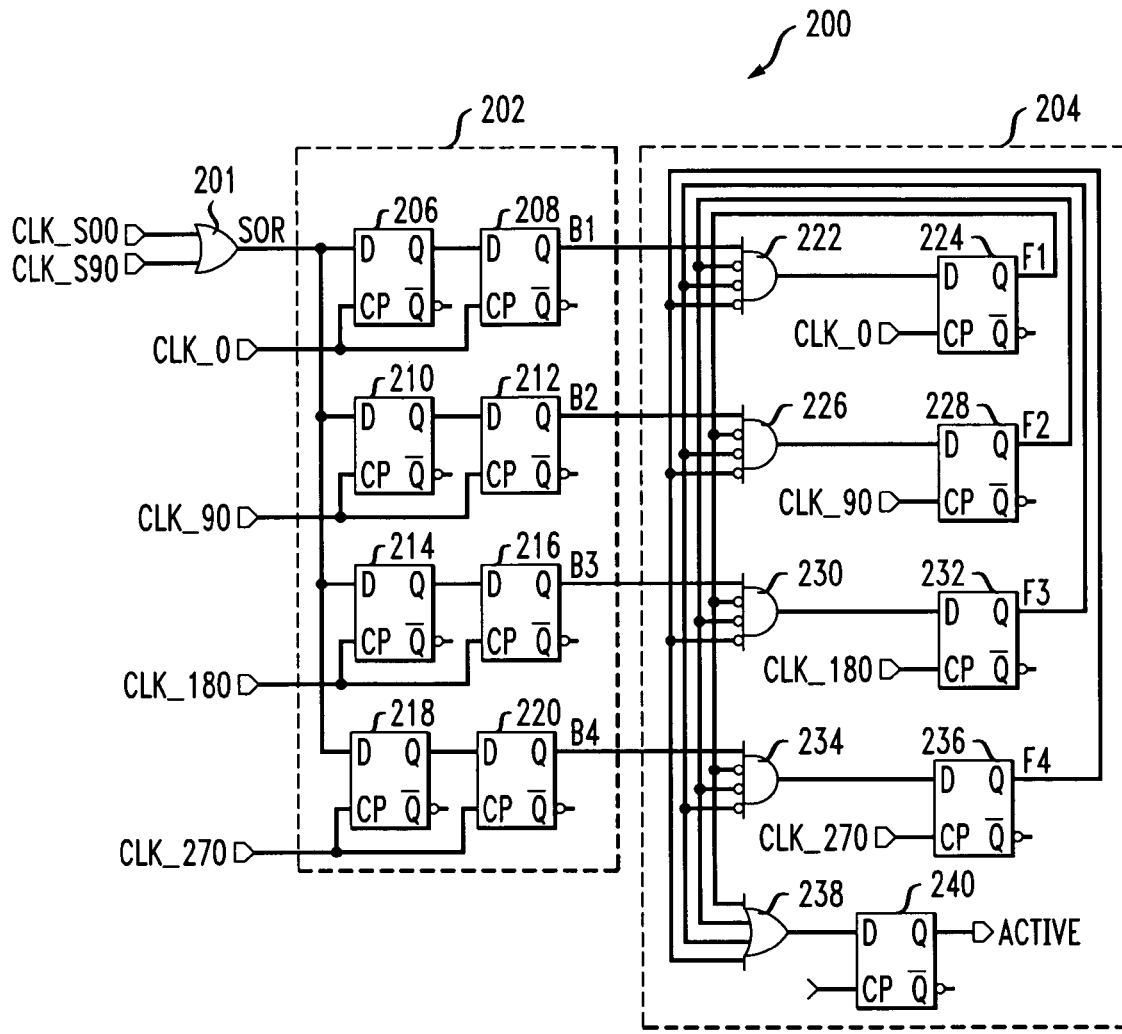
FIG. 2A is a schematic diagram illustrating an exemplary activity detector circuit which may be used in the circuit of FIG. 1, in accordance with one embodiment of the invention.

FIG. 2A is a schematic diagram depicting an exemplary activity detector circuit 200 suitable for use in the memory interface circuit 100 shown in FIG. 1, in accordance with one embodiment of the invention. The exemplary activity detector circuit 200 includes synchronization circuitry 202 and a controller 204 operatively coupled to the synchronization circuitry. The synchronization circuitry is preferably operative to receive a plurality of clock signals, namely, clk0, clk90, clk180 and clk270, and an asynchronous input signal, SOR, which is a function of a read data strobe, DQS, and to generate a plurality of output control signals, namely, B1, B2, B3 and B4, which are functions of the input signal SOR and the respective clock signals. Input signal SOR is preferably generated by an OR logic gate 201, which functions to logically OR a read data strobe signal, CLK_S00, which is preferably based on the read data strobe DQS, and a 90 degree phase shifted version of the read data strobe signal, namely, CLK_S90. The synchronization circuitry is preferably configured such that once a change in logic state of the input signal SOR is detected, the logic states of the respective output control signals will change accordingly as a function of the corresponding clock signals.

The clock signals clk0, clk90, clk180 and clk270 preferably are of substantially the same frequency as a core reference clock signal, which may be generated externally to the activity detector circuit 200, and have different phases relative to one another. For example, clock signal clk0 may be considered a zero phase clock signal, while clock signal clk90 is shifted in phase by 90 degrees relative to clk0, clock signal clk180 is shifted in phase by 180 degrees relative to clk0 and 90 degrees relative to clk90, and clock signal clk270 is shifted in phase by 270 degrees relative to clk0, 180 degrees relative to clk90 and 90 degrees relative to clk180. Since in a standard DDR SDRAM system it is necessary to generate a double rate (2×) clock, one skilled in the art will find it relatively easy to generate clock signals of four different phases. It is to be appreciated that the phase difference(s) between the respective clock signals is not limited to any particular amount(s). Furthermore, the invention is not limited to any particular number of clock signals. For instance, in another embodiment of the invention, the synchronization circuitry 202 may be configured to receive eight clock signals, each of the clock signals being phase shifted from one another by multiples of 45 degrees.

The synchronization circuitry 202 preferably includes a plurality of flip-flops, such as, for example, D-type flip-flops (DFFs), 206, 208, 210, 212, 214, 216, 218 and 220. The DFFs are preferably connected together in pairs, with each pair of DFFs being clocked by a respective one of the clock signals. Specifically, for a first pair of DFFs, a data input (D) of DFF 206 receives input signal SOR, an output (Q) of DFF 206 is connected to a data input of DFF 208, an output of DFF 208 generates the output control signal B1 which is supplied to the controller 204, and clock inputs of DFFS 206 and 208 receive clock signal clk0. For a second pair of DFFs, a data input of DFF 210 receives input signal SOR, an output of DFF 210 is connected to a data input of DFF 212, an output of DFF 212 generates the output control signal B2 which is supplied to the controller 204, and clock inputs of DFFs 210 and 212 receive clock signal clk90. For a third pair of DFFs, a data input of DFF 214 receives input signal SOR, an output of DFF 214 is connected to a data input of DFF 216, an output of DFF 216 generates the output control signal B3 which is supplied to the controller 204, and clock inputs of DFFs 214 and 216 receive clock signal clk180. Likewise, for a fourth pair of DFFs, a data input of DFF 218 receives input signal SOR, an output of DFF 218 is connected to a data input of DFF 220, an output of DFF 220 generates the output control signal B4 which is supplied to the controller 204, and clock inputs of DFFs 218 and 220 receive clock signal clk270.

Since the input signal SOR arrives asynchronously as a function of the read data strobe signal DQS generated by a particular DDR SDRAM array external to the activity detector 200, once a change in state of the input signal SOR is detected, the output control signal whose corresponding clock signal has a phase that is most closely synchronized to the change in state of the input control signal SOR will be latched first by the corresponding pair of DFFs, followed by the output control signal whose corresponding clock signal is next closest in phase to the change in state of SOR, and so on. By way of example only, assume that a rising edge of clock signal clk0 occurs just after input SOR transitions from a logic low level to a logic high level. Output control signal B1, corresponding to clock signal clk0, will therefore be the first of the output control signals to change state, after a latency of up to two clock cycles. Output control signal B2 will be the next signal to change state, followed by output control signal B3, and then output control signal B4.

Controller 204 is preferably operative to receive the plurality of control signals generated by the synchronization circuitry 202 and to select which one of the output control signals is the first to transition, thereby selecting the clock phase which is most closely aligned to the asynchronous input signal SOR. The controller 204 preferably includes a 4-input AND gate connected to a flip-flop (e.g., a DFF) for each of the corresponding control signals B1 through B4. Specifically, a first input of a first 4-input AND gate 222 receives control signal B1, an output of AND gate 222 is connected to a data input (D) of a first DFF 224, a clock input (CP) of the first DFF receives clock signal clk0, and an output (Q) of first DFF 224 generates output control signal F1. A first input of a second 4-input AND gate 226 receives control signal B2, an output of AND gate 226 is connected to a data input of a second DFF 228, a clock input of second DFF 228 receives clock signal clk90, and an output of second DFF 228 generates output control signal F2. A first input of a third 4-input AND gate 230 receives control signal B3, an output of AND gate 230 is connected to a data input of a third DFF 232, a clock input of third DFF 232 receives clock signal clk180, and an output of third DFF 232 generates output control signal F3. Likewise, a first input of a fourth 4-input AND gate 234 receives control signal B4, an output of AND gate 234 is connected to a data input of a fourth DFF 236, a clock input of fourth DFF 236 receives clock signal clk270, and an output of fourth DFF 236 generates output control signal F4.

The output control signals F1 through F4 generated by controller 204 are preferably inverted and connected to second, third and fourth inputs of the respective AND gates 222, 226, 230, 234, in a feedback arrangement. Specifically, output signal F1 is connected to the second input of AND gates 226, 230 and 234. Output signal F2 is connected to the second input of AND gate 222, and to the third input of AND gates 230 and 234. Output signal F3 is connected to the third input of AND gates 222 and 230, and to the fourth input of AND gate 234. Output signal F4 is connected to the fourth input of AND gates 222, 226 and 230. In this manner, once a change in state of one of the output signals F1, F2, F3, F4 is detected, the controller 204 is operative to latch the output signal that changed state and to lock out the remaining output signals from changing state. All of the output signals F1 through F4 are preferably logically ORed together by 4-input OR gate 238. The output of OR gate 238 is supplied to a data input of DFF 240, which functions to latch an ACTIVE output signal generated by controller 204 indicating the presence of data to be read and framing a window for reading the data.

The activity detector circuit 200 functions reasonably well as long as there is sufficient time between consecutive read operations, such as, for example, at least two clock cycles. This is due primarily to the arrangement of the synchronization circuitry 202. Since each pair of DFFs (e.g., 206, 208) is clocked by the same clock signal, there is a minimum latency of one clock cycle, assuming the read data strobe signal is coincident with a rising edge of the corresponding clock signal (e.g., clk0). By modifying the synchronization circuitry 202, the activity detector circuit 200 can be configured to beneficially reduce the amount of time required between consecutive read operations.

Figure 2B:
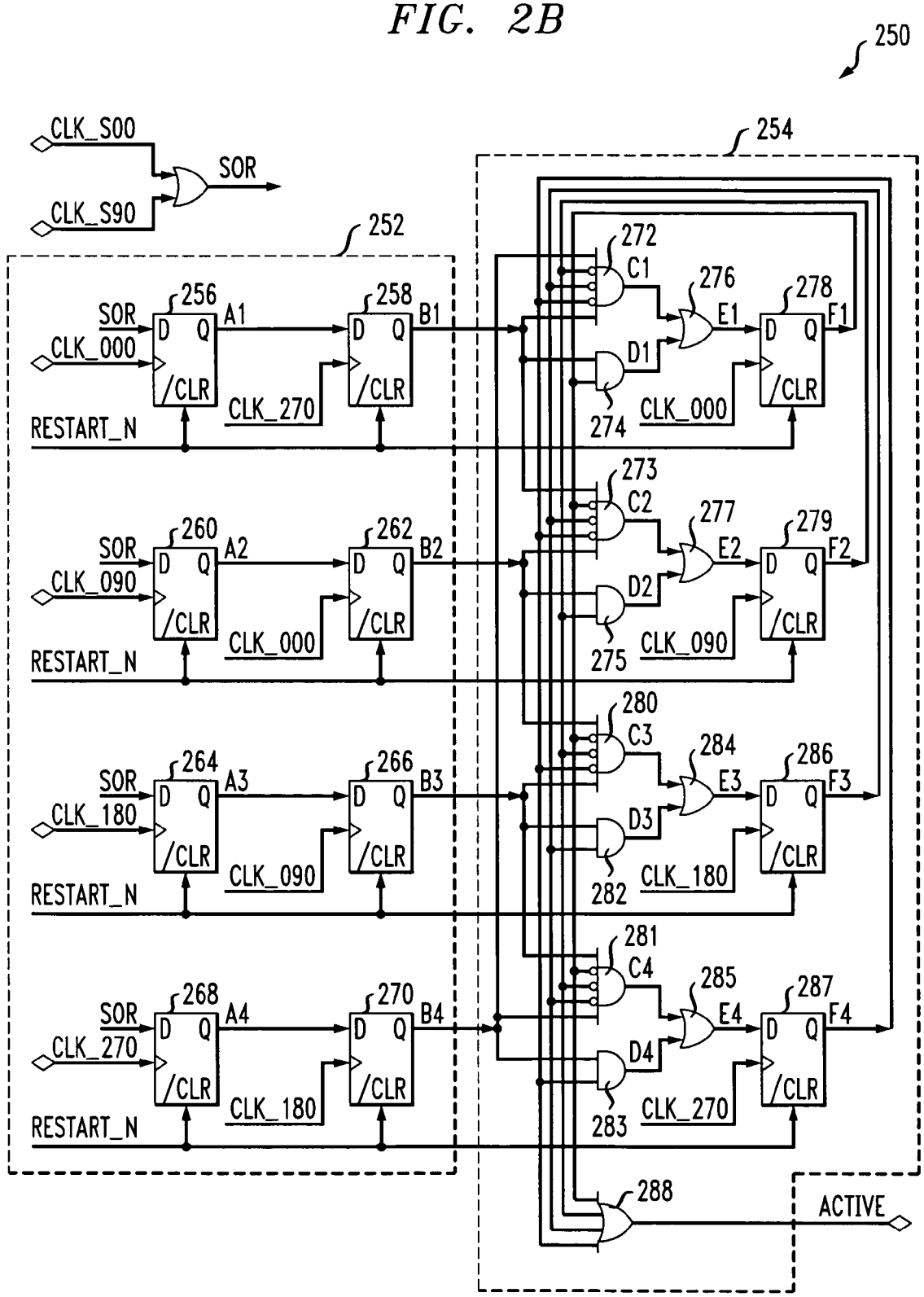
FIG. 2B is a schematic diagram illustrating an exemplary activity detector circuit may be used in the circuit of FIG. 1, formed in accordance with another embodiment of the invention.

FIG. 2B is a schematic diagram depicting an exemplary activity detector circuit 250 suitable for use in the memory interface circuit 100 shown in FIG. 1, in accordance with another embodiment of the invention. The exemplary activity detector circuit 250, like activity detector circuit 200 shown in FIG. 2A, comprises synchronization circuitry 252 and a controller 254 operatively coupled to the synchronization circuitry. The synchronization circuitry 252 is preferably operative to receive a plurality of clock signals, namely, CLK_000, CLK_090, CLK_180 and CLK_270, and an asynchronous input signal, SOR, which is a logical OR of the read data strobe signal CLK_S00 and a 90 degree phase shifted version of the read data strobe, CLK_S90, and to generate a plurality of output control signals, namely, B1, B2, B3 and B4, which are functions of the input signal SOR and the respective clock signals. The synchronization circuitry 252 is preferably configured such that once a change in the logic state of the input signal SOR is detected, the logic states of the respective output control signals B1, B2, B3, B4 will change accordingly as a function of the corresponding clock signals.

The clock signals CLK_000, CLK_090, CLK_180 and CLK_270 are preferably of substantially the same frequency as a core reference clock signal, which may be generated externally to the activity detector circuit 250 (e.g., by a phase-locked loop (PLL) in the memory system), and have different phases relative to one another. For example, clock signal CLK_000 may be considered a zero phase clock signal, while clock signal CLK_090 is shifted in phase by 90 degrees relative to CLK_000, clock signal CLK_180 is shifted in phase by 180 degrees relative to CLK_000 and 90 degrees relative to CLK_090, and clock signal CLK_270 is shifted in phase by 270 degrees relative to CLK_000, 180 degrees relative to CLK_090 and 90 degrees relative to CLK_180. It is to be appreciated that the phase difference(s) between the respective clock signals is not limited to any particular amount(s). Furthermore, the invention is not limited to any particular number of clock signals. For instance, in another embodiment of the invention, the synchronization circuitry 252 may be configured to receive eight clock signals, each of the clock signals being phase shifted from one another by multiples of 45 degrees.

The synchronization circuitry 252 preferably includes a plurality of flip-flops, such as, for example, DFFs, 256, 258, 260, 262, 264, 266, 268 and 270. The DFFs are preferably connected together in pairs. Specifically, for a first pair of DFFs, a data input of DFF 256 receives input signal SOR, an output of DFF 256 is connected to a data input of DFF 258, and an output of DFF 258 generates the output control signal B1 which is supplied to controller 254. For a second pair of DFFs, a data input of DFF 260 receives input signal SOR, an output of DFF 260 is connected to a data input of DFF 262, and an output of DFF 262 generates the output control signal B2 which is supplied to the controller 254. For a third pair of DFFs, a data input of DFF 264 receives input signal SOR, an output of DFF 264 is connected to a data input of DFF 266, and an output of DFF 266 generates the output control signal B3 which is supplied to the controller 254. Likewise, for a fourth pair of DFFs, a data input of DFF 268 receives input signal SOR, an output of DFF 268 is connected to a data input of DFF 270, and an output of DFF 270 generates the output control signal B4 which is supplied to the controller 254.

As previously stated, the synchronization circuitry 252 in activity detector circuit 250 is preferably modified compared to synchronization circuitry 202 shown in FIG. 2A, so as to reduce a latency thereof, and thereby advantageously minimize the number of clock cycles required between consecutive read operations. This can be accomplished, in accordance with one aspect of the invention, by clocking each of the DFFs in a given pair of DFFs in synchronization circuitry 252 with clock signals that are shifted in phase from one another, such as, for example, by 270 degrees. Using this circuit configuration, the SOR signal propagates through the pairs of DFFs within one clock cycle, rather than requiring two clock cycles as in the case of the activity detector circuit 200 of FIG. 2A. Thus, for the first pair of DFFs, a clock input of DFF 256 preferably receives clock signal CLK_000 and a clock input of DFF 258 preferably receives clock signal CLK_270. For the second pair of DFFs, a clock input of DFF 260 preferably receives clock signal CLK_090 and a clock input of DFF 262 preferably receives clock signal CLK_000. For the third pair of DFFs, a clock input of DFF 264 preferably receives clock signal CLK_180 and a clock input of DFF 266 preferably receives clock signal CLK_090. For the fourth pair of DFFs, a clock input of DFF 268 preferably receives clock signal CLK_270 and a clock input of DFF 270 preferably receives clock signal CLK_180. It is to be understood that the phase difference between two DFFs in a given pair of DFFs in the synchronization circuitry 252 is not limited to any particular value.

Controller 254 is preferably operative to receive the plurality of control signals B1, B2, B3, B4 generated by the synchronization circuitry 252 and to select which one of the output control signals is the first to transition, thereby selecting the clock phase which is most closely aligned to the read data strobe signal. While controller 204 shown in FIG. 2A is suitable for use in the activity detector circuit 250, controller 254 has been modified slightly compared to controller 204 in order to eliminate a metastable condition which can occur when the read data strobe is precisely aligned with a rising edge of one of the reference clock signal CLK_000. Specifically, when the read data strobe is substantially aligned with the reference clock signal CLK_000, a metastable condition may result wherein the logic state of the first data bit cannot be determined with adequate certainty. In order to avoid this potential condition, the controller 254 is preferably configured to select the second closest clock phase which captures the first data bit. The slight penalty in latency which may result by employing this approach is beneficially balanced by the elimination of any metastable conditions that can occur.

Thus, in accordance with another aspect of the invention, controller 254 preferably comprises, for each of the signal paths corresponding to reference clock signals CLK_000, CLK_090, CLK_180, CLK_270, a combinatorial logic circuit including a 5-input AND gate, a 2-input AND gate, and a 2-input OR gate. Each of the control signals B1, B2, B3, B4 generated by the synchronization circuitry 252 is preferably connected to a pair of combinatorial logic circuits associated with a given reference clock signal and a reference clock signal having a next adjacent phase (e.g., CLK_000 and CLK_090). Specifically, in a first combinatorial logic circuit, first inputs of a 5-input AND gate 272 and a 2-input AND gate 274 receive control signal B1 generated by synchronization circuitry 252. A second input of AND gate 272 receives control signal B4. Output signals C1 and D1 generated by AND gates 272 and 274, respectively, are supplied to an OR gate 276 which generates an output control signal E1. In a second combinatorial logic circuit, first inputs of a 5-input AND gate 273 and a 2-input AND gate 275 receive control signal B2 generated by synchronization circuitry 252. A second input of AND gate 273 receives control signal B1. Output signals C2 and D2 generated by AND gates 273 and 275, respectively, are supplied to an OR gate 277 which generates an output control signal E2. In a third combinatorial logic circuit, first inputs of a 5-input AND gate 280 and a 2-input AND gate 282 receive control signal B3 generated by synchronization circuitry 252. A second input of AND gate 280 receives control signal B2. Output signals C3 and D3 generated by AND gates 280 and 282, respectively, are supplied to an OR gate 284 which generates an output control signal E3. Likewise, in a fourth combinatorial logic circuit, first inputs of a 5-input AND gate 281 and a 2-input AND gate 283 receive control signal B4 generated by synchronization circuitry 252. A second input of AND gate 281 receives control signal B3. Output signals C4 and D4 generated by AND gates 281 and 283, respectively, are supplied to an OR gate 285 which generates an output control signal E4.

Output control signals E1, E2, E3 and E4 are preferably supplied to corresponding latch circuits. For example, control signal E1 is supplied to a data input of a first DFF 278 which generates an output signal F1. A clock input of DFF 278 preferably receives reference clock signal CLK_000. Control signal E2 is supplied to a data input of a second DFF 279 which generates an output signal F2. A clock input of DFF 279 preferably receives reference clock signal CLK_090. Control signal E3 is supplied to a data input of a third DFF 286 which generates an output signal F3. A clock input of DFF 286 preferably receives reference clock signal CLK_180. Control signal E4 is supplied to a data input of a fourth DFF 287 which generates an output signal F4. A clock input of DFF 287 preferably receives reference clock signal CLK_270.

The output signals F1, F2, F3, F4 generated by the respective latch circuits are preferably fed back to inputs of the combinatorial logic circuits. Specifically, output signal F1 is preferably connected to a second input of AND gate 274, and to third inputs of AND gates 273, 280 and 281. Output signal F2 is preferably connected to a second input of AND gate 275, a third input of AND gate 272, and fourth inputs of AND gates 280 and 281. Output signal F3 is preferably connected to a second input of AND gate 282, fourth inputs of AND gates 272 and 273, and a fifth input of AND gate 281. Output signal F4 is preferably connected to a second input of AND gate 283, and fifth inputs of AND gates 272, 273 and 280. Using this feedback approach, the controller 254 is able to select an appropriate clock signal and lock out the remaining clock signals. Output signals F1, F2, F3, F4 are preferably corresponding inputs of a 4-input OR gate 288, which generates an output signal ACTIVE that is indicative of data to be read from external DDR SDRAM.

In order to initialize the activity detector circuit 250 to a known logic state, a reset signal, namely, RESTART_N, is preferably provided to the activity detector circuit. The reset signal may be generated external to the activity detector circuit 250, such as by the count start circuit 116 shown in FIG. 1, as previously explained. The reset signal RESTART_N is preferably an active low signal that is supplied to a clear input (CLR) of each of the DFFs in the synchronization circuitry 252, namely, DFFs 256, 258, 260, 262, 264, 266, 268 and 270, and each of the DFFs in the controller 254, namely, DFFs 278, 279, 286 and 287.

As previously explained, the strobe signal SOR used by the activity detector circuit (e.g., 100 or 200) is preferably based on a logical OR of the read data strobe signal, CLK_S00, which is a function of the read data strobe DQS, and a 90 degree delayed version of the read data strobe signal, CLK_S90. This approach provides certain benefits compared to using the read data strobe signal CLK_S00 alone, as will be explained in conjunction with the illustrative cases shown in FIGS. 3 and 4.

Figure 3:
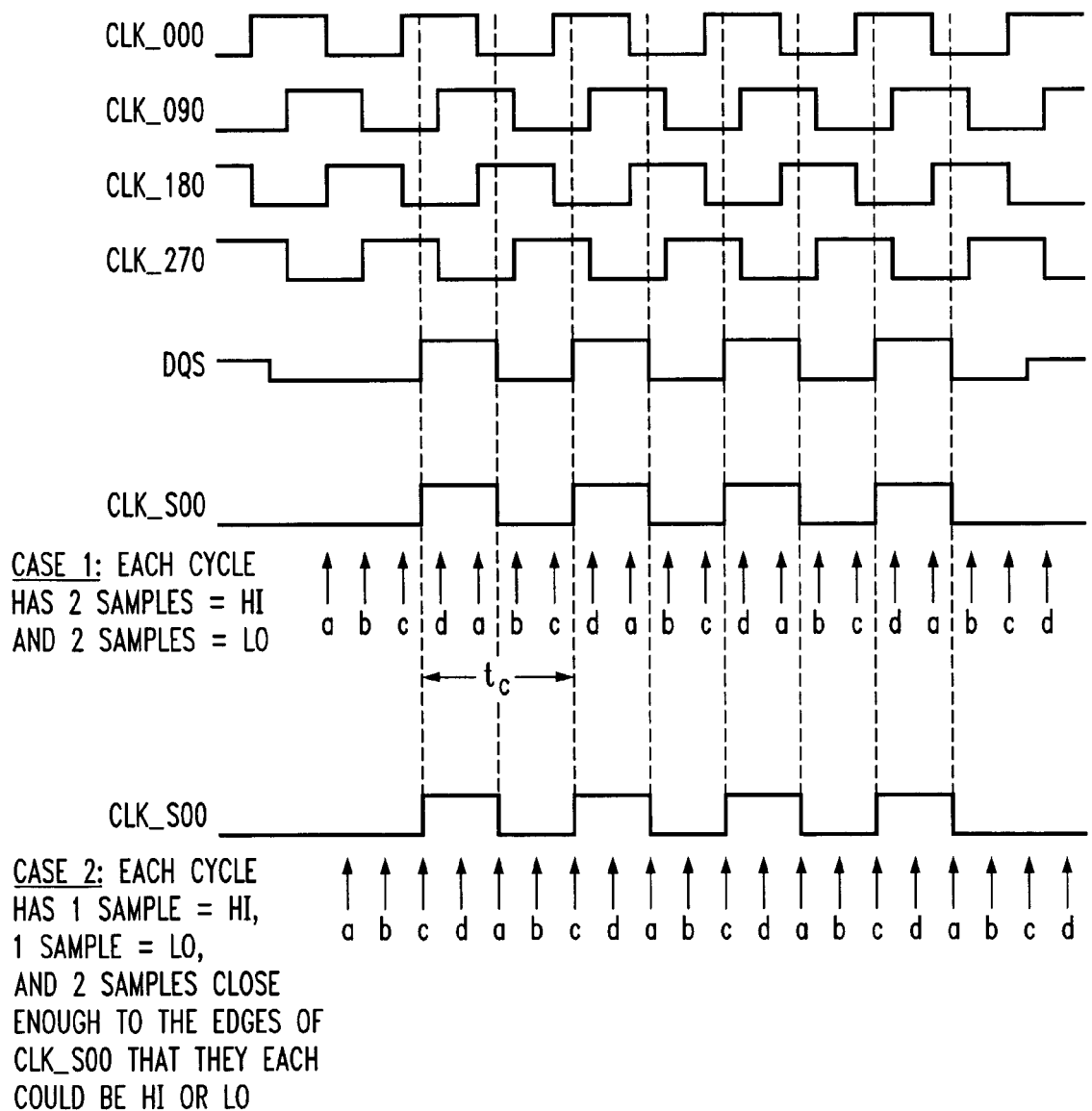
FIG. 3 is a logic timing diagram illustrating two exemplary cases for sampling a received burst of data based only on an undelayed read data strobe, in accordance with one aspect of the present invention.

By way of example only and without loss of generality, FIG. 3 is a logic timing diagram illustrating two exemplary cases, namely, Case 1 and Case 2, for determining when to sample a burst of data based only on an undelayed read data strobe signal, CLK_S00, in accordance with one aspect of the invention. In Case 1, each clock cycle, $t_C$, of the read data strobe signal CLK_S00, contains two logic high samples, labeled "a" and "d," and two logic low samples, labeled "b" and "c." In this case, the samples labeled "d" are the first to go high after the rising edge of the strobe CLK_S00, but the samples labeled "a" may be the better choice, especially as the "d" samples move near the leading edge of CLK_S00, due, for example, to PVT variations. Thus, the exact phase relationship is important in determining whether the best samples are those that begin with the first or second high sample following the start of a received burst of data. There is a lack of sufficient information in this case to unambiguously make such a determination.

In Case 2, each clock cycle $t_C$ includes one logic high sample, labeled "d," one logic low sample, labeled "b," and two samples, labeled "c" and "a," that are substantially coincident with the rising and falling edges of the read strobe signal CLK_S00 such that these samples may be considered either a logic high or a logic low. In this case, the samples labeled "d" are the best choice, but generating a rule to unambiguously select the reference clock phase corresponding to sample "d" is essentially not possible since samples "a" and "c" cannot be resolved with certainty.

Suppose, for example, that the first sample "c" in a given burst resolves to a logic high state. The phase corresponding to sample "c" would therefore be the best to sample the burst. However, depending on certain characteristics of the memory system, sample "c" cannot be relied upon to consistently resolve to a logic high state. Alternatively, suppose that sample "c" resolves to a logic low state, and thus sample "d" would be the first sample to go high. As previously stated, it is preferred to use the second sample to go high as the proper phase selection, which would be sample "a." However, sample "a," being coincident with the falling edge of CLK_S00, cannot be resolved to a logic high state with certainty and may, in fact, change its logic state as a function of PVT variations. If the first sample to go high during each clock cycle of CLK_S00 is used, then sometimes the clock phase corresponding to sample "c" would be selected and other times the clock phase corresponding to sample "d" would be selected. If a phase corresponding to sample "c" is selected followed by a phase corresponding to sample "d," and if CLK_000 corresponds to sample "c," then the activity detector will skip one cycle. This means that the read latency would be variable, which is generally not desirable from the standpoint of the overall memory system.

Figure 4:
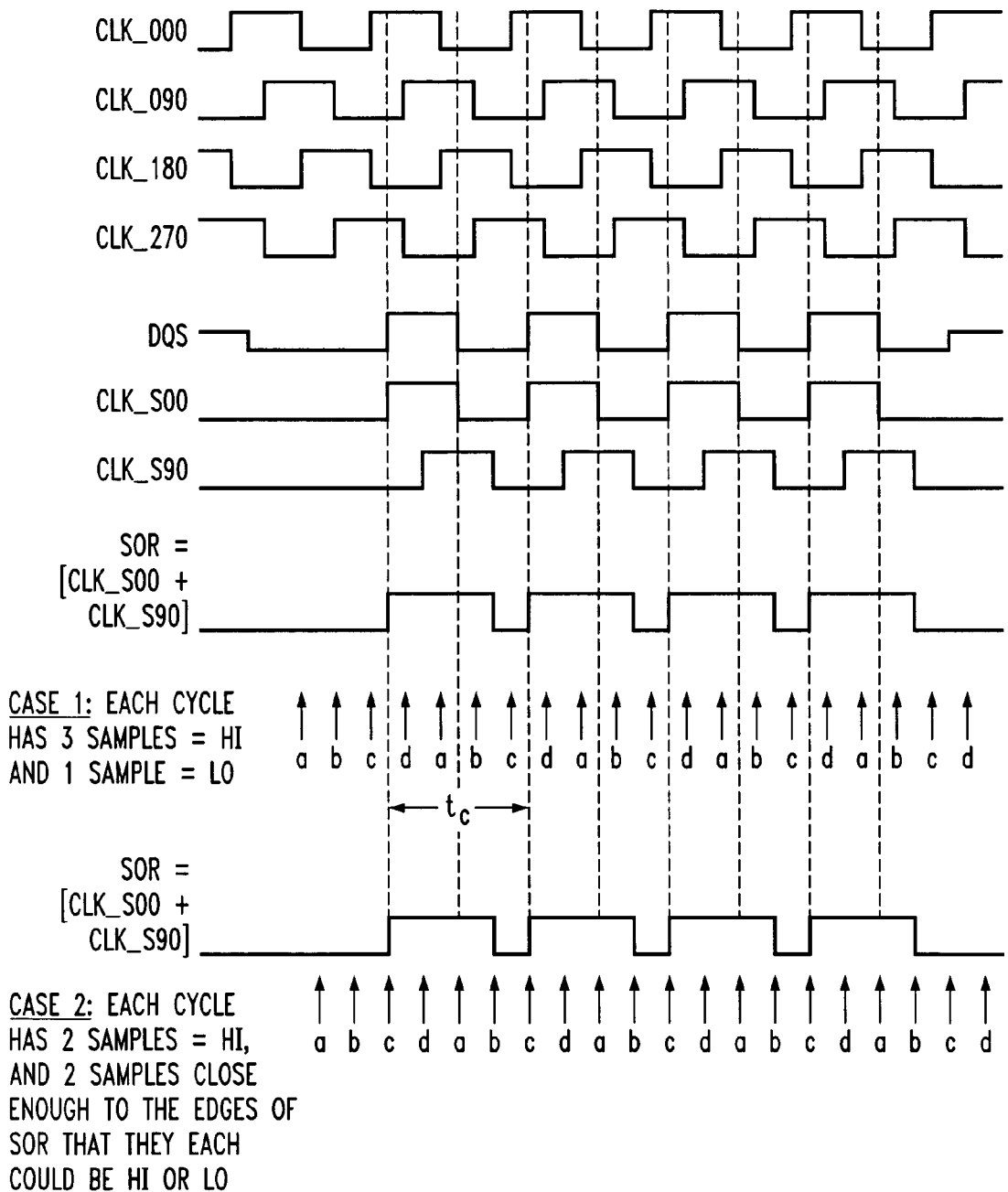
FIG. 4 is a logic timing diagram illustrating two exemplary cases for sampling a received burst of data using a delayed read data strobe, in accordance with another aspect of the present invention.

FIG. 4 is a logic timing diagram illustrating two exemplary cases, namely, Case 1 and Case 2, for sampling a received burst of data using read data strobe signal SOR, which is a function of the read data strobe CLK_S00 and a delayed read data strobe CLK_S90, in accordance with another aspect of the invention. In Case 1, each cycle, tc, of the read data strobe signal SOR includes three logic high samples, labeled "d," "a" and "b," and one logic low sample, labeled "c." The samples labeled "d" are the first to go high after the rising edge of the SOR signal, but the samples labeled "a" are a preferably choice since they are centered in the active (logic high) portion of the SOR signal. The other two samples, namely, samples labeled "d" and "b," are too close to the rising and falling edges, respectively, of the SOR signal. Accordingly, the clock phase corresponding to the second sample to go high is preferably selected as the sampling phase.

In Case 2, each cycle $t_C$ of the read data strobe signal SOR includes two logic high samples, labeled "d" and "a," and two samples that are substantially coincident with the rising and falling edges of the SOR signal such that the samples may be considered either a logic high or a logic low, labeled "c" and "b." In this case, the samples labeled "a" and "d" are equally appropriate choices. If the first sample, labeled "c," of the burst of data resolves to a logic high state, then sample "d" will be the second sample to go high, and the reference clock phase corresponding to sample "d" is preferably used thereafter for the duration of the burst. Alternatively, if sample "c" resolves to a logic low state, then sample "a" will be the second sample to go high, and therefore the reference clock phase corresponding to sample "a" is preferably used thereafter for the duration of the burst. The clock phases corresponding to samples "b" or "c" are preferably avoided as sampling phases, since neither of these samples can be relied upon to be high with any certainty.

Figure 5:
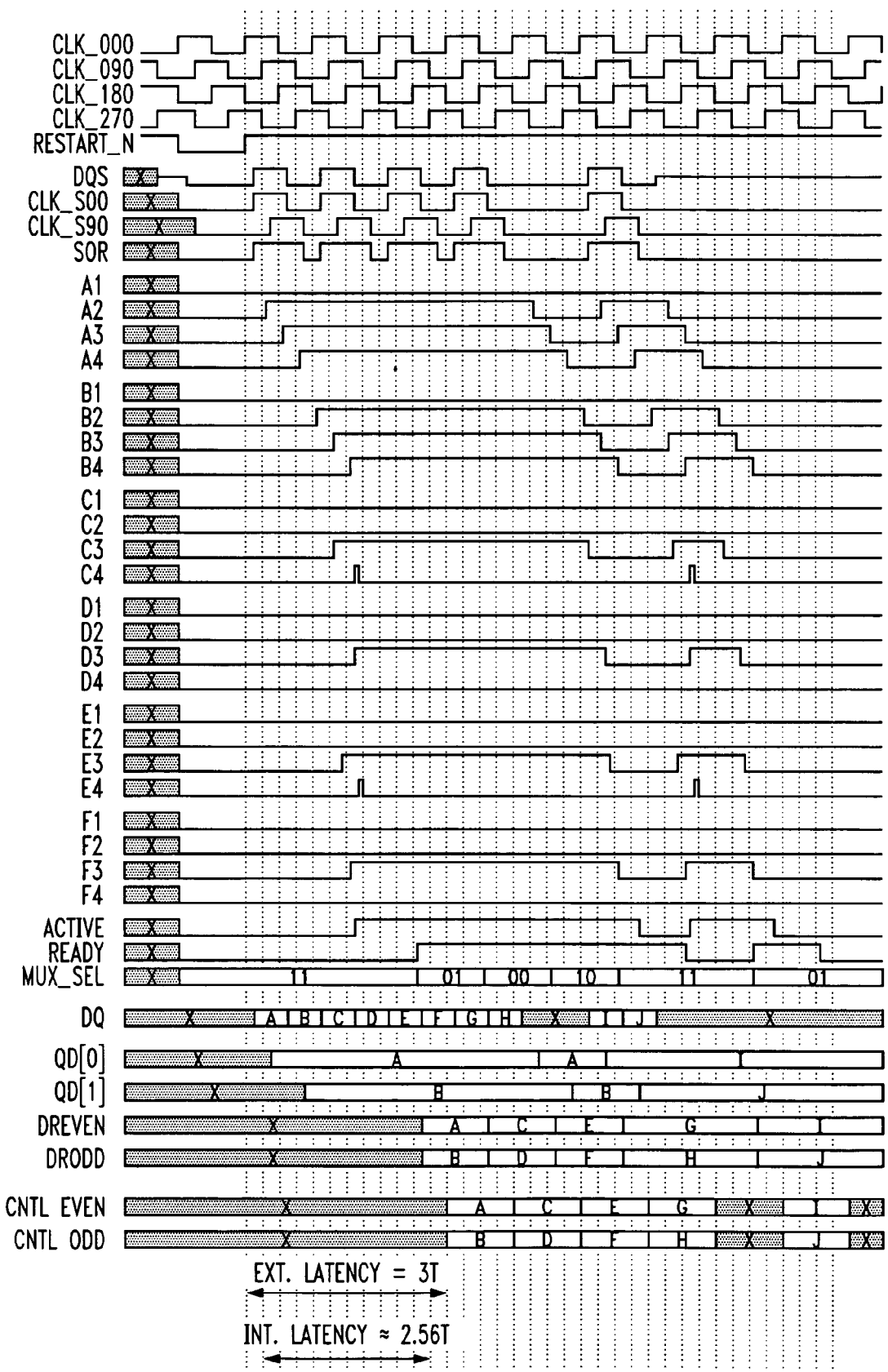
FIGS. 5-7 are exemplary logic timing diagrams illustrating operation of the activity detector depicted in FIG. 2B, in accordance with the present invention.
Figure 6:
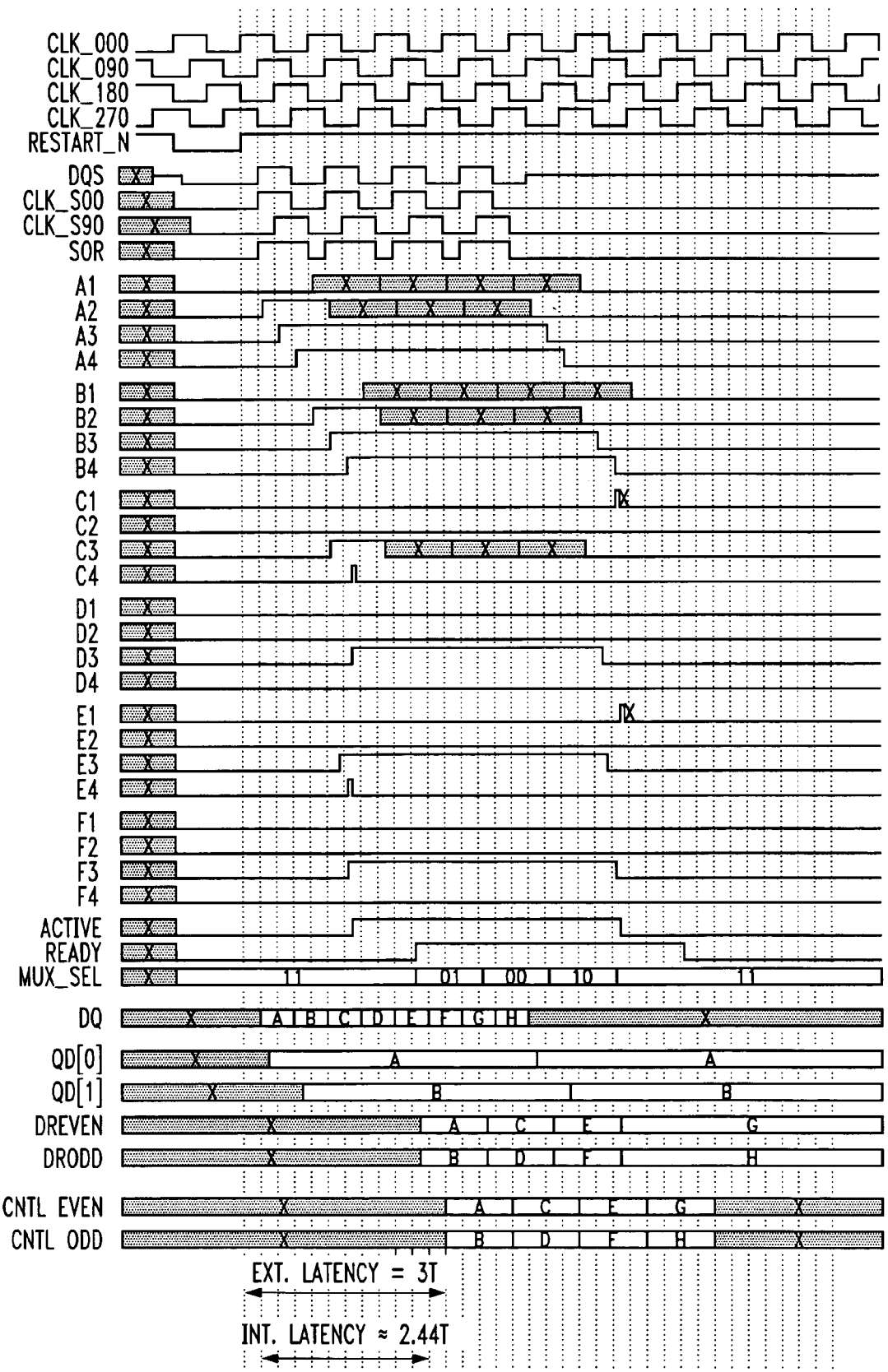
Figure 7:
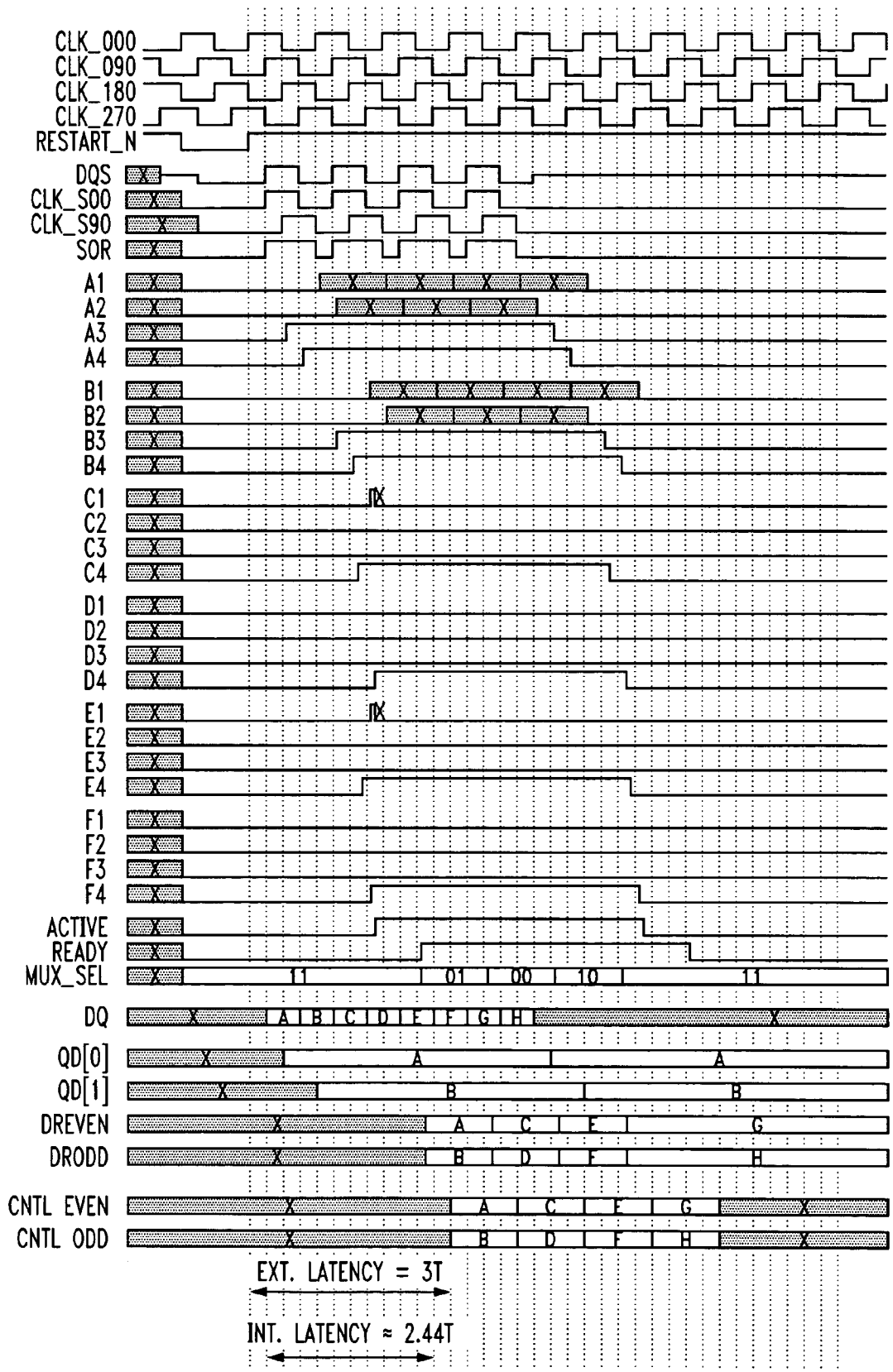

By way of example only, FIGS. 5-7 are exemplary logic timing diagrams illustrating operation of the activity detector depicted in FIG. 2B, in accordance with aspects of the present invention. FIG. 5 depicts an exemplary nominal operation of the activity detector circuit 250 of FIG. 2B with a round trip delay of 0.125 T, where T is a period of the reference clock CLK_000. In this scenario, there is no metastable condition since the read data strobe DQS is not coincident with any of the rising or falling edges of the reference clocks CLK_000, CLK_090, CLK_180, CLK_270. An internal read latency of the activity detector circuit in this case is about 2.56 T, which is less than an external read latency of 3 T.

FIG. 6 depicts an exemplary nominal operation of the activity detector circuit 250 of FIG. 2B with a round trip delay of 0.25 T. In this scenario, the rising edge of the read data strobe DQS is coincident with the rising edge of reference clock signal CLK_090 and the falling edge of reference clock signal CLK_270. Consequently, a metastable condition may exist, particularly at outputs A1 and A2 of DFFs 256 and 260, respectively, shown in FIG. 2B. In FIG. 6, it is assumed that the first data sample at output A2 resolves to a logic high state. The internal read latency of the activity detector circuit in this case is about 2.44 T.

FIG. 7 depicts an exemplary nominal operation of the activity detector circuit 250 of FIG. 2B with a round trip delay of 0.25 T, which as previously explained, results in the presence of a metastable condition. In this case, however, it is assumed that the first data sample at output A2 resolves to a logic low state. The internal read latency of the activity detector circuit in this case is about 2.44 T.

Figure 8:
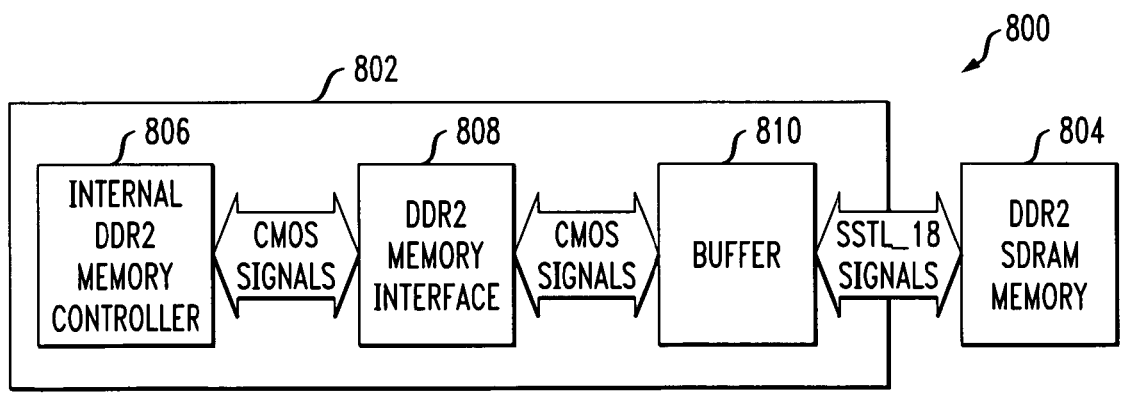
FIG. 8 is a block diagram illustrating at least a portion of an exemplary memory system in which the techniques of the present are implemented.

FIG. 8 is a simplified block diagram illustrating at least a portion of an exemplary memory system 800 in which the techniques of the present invention are implemented. The memory system 800 preferably comprises a controller and PHY circuit 802 connected to a DDR2 SDRAM memory array 804. The controller and PHY circuit 802 includes an internal DDR2 memory controller circuit 806 operatively coupled to a DDR2 memory interface circuit 808. A buffer circuit 810 may be connected between the SDRAM memory array 804 and the memory interface circuit 808 for providing stub series terminated logic (SSTL) signals, or alternative memory control signals, to the memory array. The read activity detector circuit of the present invention may reside, for example, in the DDR2 memory interface circuit 808 of memory system 800.

At least a portion of the activity detector circuits of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A read activity detector circuit for use in a random access memory array, the circuit comprising:

a plurality of synchronizer circuits operative to receive a plurality of respective reference clock signals each having a frequency that is substantially the same as a frequency of a core reference clock and having different phases relative to one another, each of the synchronizer circuits, in response to a first control signal presented thereto, generating an output signal having one of a rising edge and a falling edge which is substantially aligned to one of a rising edge and a falling edge of the reference clock signal corresponding thereto; and a controller operative to receive the respective output signals from the plurality of synchronizer circuits and to generate an output signal as a function thereof which is indicative of data to be read from the random access memory array;

wherein at least a given one of the synchronizer circuits comprises first and second flip-flops, a data input of the first flip-flop receiving the first control signal, a clock input of the first flip-flop receiving a first one of the reference clock signals, a clock input of the second flip-flop receiving a second one of the reference clock signals, an output of the first flip-flop being connected to a data input of the second flip-flop, and an output of the second flip-flop generating the output signal of the given one of the synchronizer circuits.

2. The circuit of claim 1, wherein the output signal generated by the controller has a known phase relationship relative to the core reference clock.

3. The circuit of claim 1, wherein at least a given one of the synchronizer circuits comprises first and second flip-flops, a data input of the first flip-flop receiving the first control signal, a clock input of the first and second flip-flops being connected together and receiving a corresponding one of the reference clock signals, an output of the first flip-flop being connected to a data input of the second flip-flop, and an output of the second flip-flop generating the output signal of the given one of the synchronizer circuits.

4. The circuit of claim 1, wherein respective phases of the first and second reference clock signals are separated by a predetermined amount.

5. The circuit of claim 1, wherein the first control signal is a read data strobe signal.

6. The circuit of claim 1, wherein the read activity detector circuit comprises four synchronizer circuits, and the phases of the respective reference clock signals received by the synchronizer circuits are separated from one another by multiples of ninety degrees.

7. The circuit of claim 1, wherein the controller comprises a combinatorial logic circuit operative to receive the output signals generated by the synchronizer circuits and to determine which one of the phases of the respective reference clock signals is more closely aligned to a change in logic state of the first control signal.

8. A read activity detector circuit for use in a random access memory array, the circuit comprising:

a plurality of synchronizer circuits operative to receive a plurality of respective reference clock signals each having a frequency that is substantially the same as a frequency of a core reference clock and having different phases relative to one another, each of the synchronizer circuits, in response to a first control signal presented thereto, generating an output signal having one of a rising edge and a falling edge which is substantially aligned to one of a rising edge and a falling edge of the reference clock signal corresponding thereto; and a controller operative to receive the respective output signals from the plurality of synchronizer circuits and to generate an output signal as a function thereof which is indicative of data to be read from the random access memory array;

wherein the controller comprises a combinatorial logic circuit operative to receive the output signals generated by the synchronizer circuits and to determine which one of the phases of the respective reference clock signals is more closely aligned to a change in logic state of the first control signal;

wherein the controller further comprises a capture register operative to generate a plurality of output signals, each of the output signals generated by the capture register corresponding to a given one of the plurality of synchronizer circuits, the output signals generated by the capture register being fed back to respective inputs of the combinatorial logic circuit, the controller being configured such that a change in logic state of one of the output signals generated by the capture register disables the combinatorial logic circuit.

9. The circuit of claim 1, wherein at least one of the plurality of synchronizer circuits and the controller is operative to receive a reset signal for initializing the read activity detector circuit to a desired logic state.

10. A read activity detector circuit for use in a random access memory array, the circuit comprising:

a plurality of synchronizer circuits operative to receive a plurality of respective reference clock signals each having a frequency that is substantially the same as a frequency of a core reference clock and having different phases relative to one another, each of the synchronizer circuits, in response to a first control signal presented thereto, generating an output signal having one of a rising edge and a falling edge which is substantially aligned to one of a rising edge and a falling edge of the reference clock signal corresponding thereto; and a controller operative to receive the respective output signals from the plurality of synchronizer circuits and to generate an output signal as a function thereof which is indicative of data to be read from the random access memory array;

wherein the controller comprises:
first, second, third and fourth flip-flops, each of the flip-flops having a clock input, a data input, and an output;
first, second, third and fourth AND gates, each of the AND gates having first, second, third and fourth inputs and an output; and
an OR gate;
wherein the first input of the first AND gate being connected to a first one of the synchronizer circuits, the first input of the second AND gate being connected to a second one of the synchronizer circuits, the first input of the third AND gate being connected to a third one of the synchronizer circuits, the first input of the fourth AND gate being connected to a fourth one of the synchronizer circuits, a logical inversion of the output of the first flip-flop being connected to the second inputs of the second, third and fourth AND gates, a logical inversion of the output of the second flip-flop being connected to the second input of the first AND gate and to the third inputs of the third and fourth AND gates, a logical inversion of the output of the third flip-flop being connected to the third inputs of the first and second AND gates and to the fourth input of the fourth AND gate, an inversion of the output of the fourth flip-flop being connected to the fourth inputs of the first, second and third AND gates, the outputs of the first, second, third and fourth AND gates are connected to the data inputs of the first, second, third and fourth flip-flops, respectively, the clock inputs the first, second, third and fourth flip-flops receiving the same reference clock signals as the first, second, third and fourth synchronizer circuits, respectively, first, second, third and fourth inputs of the OR gate receiving the outputs of the first, second, third and fourth flip-flops, respectively, the OR gate generating the output signal which is indicative of data to be read from the random access memory array.

11. A memory system, comprising:

a random access memory array; and a memory controller circuit connected to the memory array, the memory controller circuit including at least one read activity detector circuit comprising:

a plurality of synchronizer circuits operative to receive a plurality of respective reference clock signals each having a frequency that is substantially the same as a frequency of a core reference clock and having different phases relative to one another, each of the synchronizer circuits, in response to a first control signal presented thereto, generating an output signal having one of a rising edge and a falling edge which is substantially aligned to one of a rising edge and a falling edge of the reference clock signal corresponding thereto; and a controller operative to receive the respective output signals from the plurality of synchronizer circuits and to generate an output signal as a function thereof which is indicative of data to be read from the random access memory array;

wherein at least a given one of the synchronizer circuits comprises first and second flip-flops, a data input of the first flip-flop receiving the first control signal, a clock input of the first flip-flop receiving a first one of the reference clock signals, a clock input of the second flip-flop receiving a second one of the reference clock signals, an output of the first flip-flop being connected to a data input of the second flip-flop, and an output of the second flip-flop generating the output signal of the given one of the synchronizer circuits.

12. The memory system of claim 11, wherein at least a given one of the synchronizer circuits comprises first and second flip-flops, a data input of the first flip-flop receiving the first control signal, a clock input of the first and second flip-flops being connected together and receiving a corresponding one of the reference clock signals, an output of the first flip-flop being connected to a data input of the second flip-flop, and an output of the second flip-flop generating the output signal of the given one of the synchronizer circuits.

13. The memory system of claim 11, wherein respective phases of the first and second reference clock signals are separated by a predetermined amount.

14. The memory system of claim 11, wherein the first control signal is a read data strobe signal.

15. The memory system of claim 11, wherein the at least one read activity detector circuit comprises four synchronizer circuits, and the phases of the respective reference clock signals received by the synchronizer circuits are separated from one another by multiples of ninety degrees.

16. The memory system of claim 11, wherein the controller in the at least one read activity detector circuit comprises a combinatorial logic circuit operative to receive the output signals generated by the synchronizer circuits and to determine which one of the phases of the respective reference clock signals is more closely aligned to a change in logic state of the first control signal.

17. A memory system, comprising:
a random access memory array; and
a memory controller circuit connected to the memory array, the memory controller circuit including at least one read activity detector circuit comprising:
a plurality of synchronizer circuits operative to receive a plurality of respective reference clock signals each having a frequency that is substantially the same as a frequency of a core reference clock and having different phases relative to one another, each of the synchronizer circuits, in response to a first control signal presented thereto, generating an output signal having one of a rising edge and a falling edge which is substantially aligned to one of a rising edge and a falling edge of the reference clock signal corresponding thereto; and
a controller operative to receive the respective output signals from the plurality of synchronizer circuits and to generate an output signal as a function thereof which is indicative of data to be read from the random access memory array;
wherein the controller in the at least one read activity detector circuit comprises a combinatorial logic circuit operative to receive the output signals generated by the synchronizer circuits and to determine which one of the phases of the respective reference clock signals is more closely aligned to a change in logic state of the first control signal;
wherein the controller in the at least one read activity detector circuit further comprises a capture register operative to generate a plurality of output signals, each of the output signals generated by the capture register corresponding to a given one of the plurality of synchronizer circuits, the output signals generated by the capture register being fed back to respective inputs of the combinatorial logic circuit, the controller being configured such that a change in logic state of one of the output signals generated by the capture register disables the combinatorial logic circuit.

18. The memory system of claim 11, wherein at least one of the plurality of synchronizer circuits and the controller in the at least one read activity detector circuit is operative to receive a reset signal for initializing the read activity detector circuit to a desired logic state.

* * * * *